United States Patent
Hanssen et al.

(10) Patent No.: US 10,925,179 B2
(45) Date of Patent: Feb. 16, 2021

(54) COOLING STRUCTURES HAVING SHIELDING FOR ELECTROMAGNETIC INTEFERENCE

(71) Applicant: Arista Networks, Inc., Santa Clara, CA (US)

(72) Inventors: Steven Alf Hanssen, San Jose, CA (US); Abbas Hosseinian, Saratoga, CA (US); Pranav Swaroop Devalla, Santa Clara, CA (US)

(73) Assignee: Arista Networks, Inc., Santa Clara, CA (US)

( * ) Notice: Subject to any disclaimer, the term of this patent is extended or adjusted under 35 U.S.C. 154(b) by 52 days.

(21) Appl. No.: 16/431,396

(22) Filed: Jun. 4, 2019

(65) Prior Publication Data

US 2020/0389995 A1 Dec. 10, 2020

(51) Int. Cl.
| F28F 7/00 | (2006.01) |
| H05K 7/20 | (2006.01) |
| G06F 1/20 | (2006.01) |
| G06F 1/18 | (2006.01) |
| H05K 9/00 | (2006.01) |

(52) U.S. Cl.
CPC ............... *H05K 7/20* (2013.01); *G06F 1/182* (2013.01); *G06F 1/20* (2013.01); *H05K 9/0007* (2013.01)

(58) Field of Classification Search
CPC ........ H05K 7/20; H05K 9/0007; G06F 1/182; G06F 1/20
USPC ......................................................... 165/186
See application file for complete search history.

(56) References Cited

U.S. PATENT DOCUMENTS

| 3,334,684 | A | * | 8/1967 | Mazorol, Jr. | ........... F25D 15/00 165/47 |
| 5,305,183 | A | * | 4/1994 | Teynor | ................. B23K 9/1062 211/41.17 |
| 5,504,924 | A | * | 4/1996 | Ohashi | ................ F28D 15/0233 361/676 |
| 7,256,991 | B2 | * | 8/2007 | Sullivan | .................... G06F 1/16 361/679.48 |
| 2017/0208708 | A1 | * | 7/2017 | Davidson | ........... H05K 7/20745 |

* cited by examiner

*Primary Examiner* — Davis D Hwu
(74) *Attorney, Agent, or Firm* — Haley Guiliano LLP

(57) ABSTRACT

The cooling system includes a series of cooling channels arranged to provide convective cooling, with inserts for shielding electromagnetic interference (EMI) that is propagated by the waveguide nature of the cooling channels. Due to the relatively open nature, the cooling channels can serve to propagate EMI energy. The inserts mitigate the EMI exiting via these channels by attenuating or blocking the EMI. The inserts are shaped to block particular frequencies of EMI. The inserts may include thin sheet metal contoured to a half-wave profile, arranged along each cooling channel.

20 Claims, 4 Drawing Sheets

COOLING STRUCTURES HAVING SHIELDING FOR ELECTROMAGNETIC INTEFERENCE

BACKGROUND

Network devices, such as modern datacenter switching systems, generally must operate at very high bandwidth with very low latency. These high-speed systems include complex integrated circuits (ICs) and other high-current active subsystems that act as a major source of unwanted electromagnetic radiation that can leak through the system assembly. These devices typically also require active cooling to maintain operation in a specified temperature range, which may lead to openings or other features that may transmit electromagnetic radiation. Products can be at risk of failing FCC/ICES standards (e.g., 47 CFR Part 15 Subpart B for Unintentional Radiators) for up to 40 GHz radiated emissions.

Current systems are typically limited by the perforation size on host system faceplates. Electromagnetic interference (EMI) limits are in conflict with large openings that are sometimes necessary for cooling. As devices increase in power consumption, so increases the cooling needs of the device and shielding capability. This causes the trade-offs in design for EMI shielding and cooling to be increasingly conflicted.

SUMMARY

In some embodiments, the present disclosure is directed to systems for providing shielding from electromagnetic interference that is propagated by the waveguide nature of cooling channels. The set of cooling channels are configured to provide convective cooling to a device, but due to their relatively open nature they can also serve to propagate EMI energy. An insert, optimized to block EMI frequencies, is provided that mitigates the EMI exiting via these cooling channels.

In some embodiments, a system for cooling and shielding a computing system includes a plurality of cooling channels and a plurality of inserts, each arranged in a cooling channel. The cooling channels are arranged in an array, each having a length, a width, and a height. The inserts provide shielding from interference at a predetermined frequency. Each insert has a thickness one order of magnitude or smaller than the width of the respective cooling channel, and a a profile shape having an amplitude less than or equal to the width of the respective cooling channel. Each insert has an insert length oriented along the length of the cooling channel.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

DETAILED DESCRIPTION

The present disclosure is directed to systems for providing EMI shielding for cooling structures of devices. Because cooling structures may include passages having relatively large spatial dimensions, there may be reduced blockage to EMI transmission from material of the cooling structures. The inclusion of EMI shielding features added to the cooling structures may provide shielding from EMI transmission, while avoiding a significant impact on cooling effectiveness.

Figure 1:
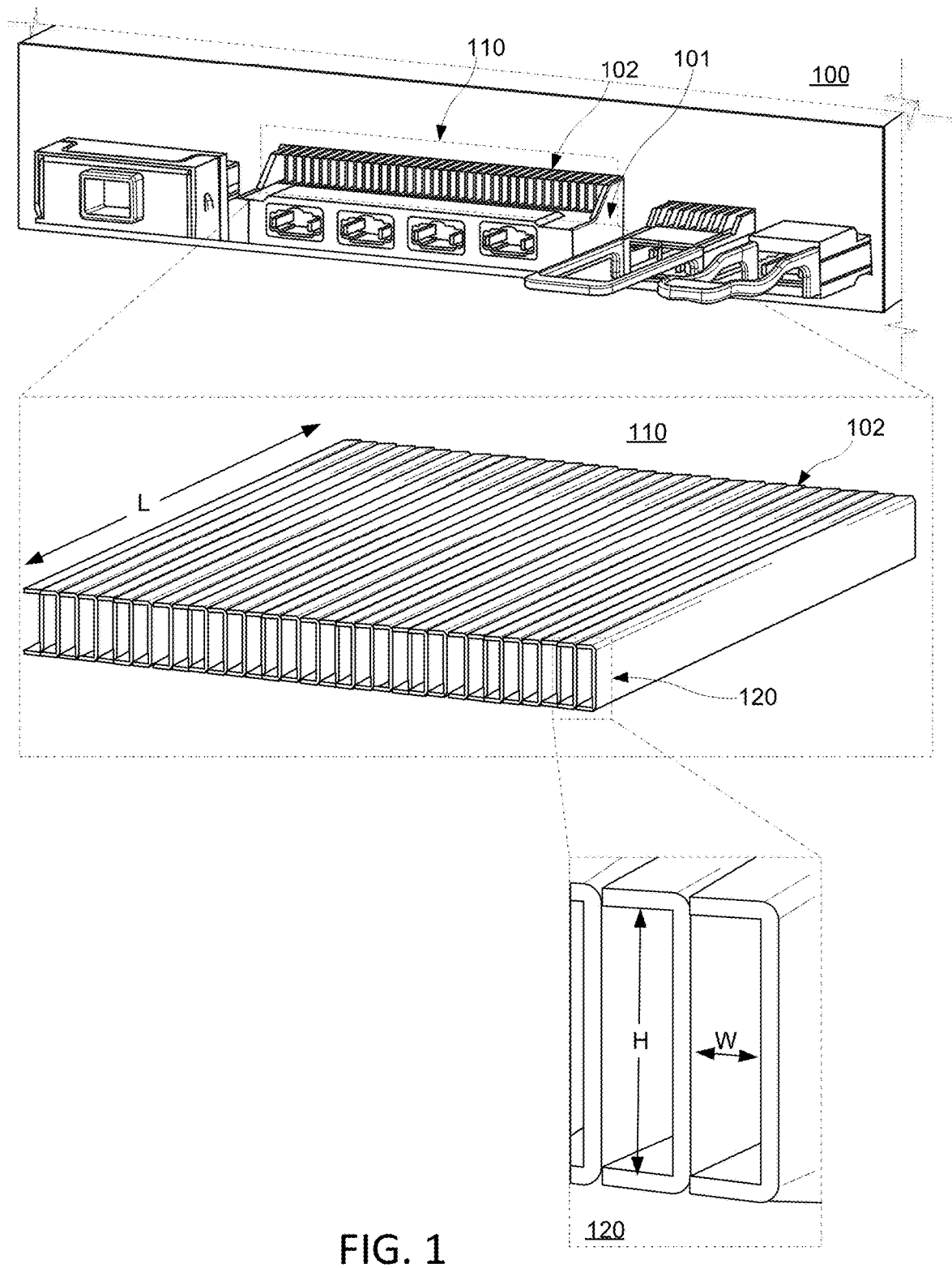
FIG. 1 shows several views of an illustrative device having cooling channels, in accordance with some embodiments of the present disclosure.

FIG. 1 shows several views of illustrative device 100 having cooling channels 102, in accordance with some embodiments of the present disclosure. Device 100 may include, for example, an optical module, a computing device, a network switch, any other suitable device, or any combination thereof. Section 120 is shown enlarged, and section 120 thereof is shown enlarged, for illustrative purposes.

Device 100 may include electronic circuitry, optical components, or both, and may operate at relatively high clock frequencies. Device 100, or components thereof, may also generate heat, which requires dissipation to maintain operation within a predetermined temperature range.

Device 100 includes module 101, which may be configured to perform a particular purpose, and may generate heat during operation. Module 101 includes cooling channels 102 (shown enlarged by section 110), which are configured to provide active or passive cooling to the internal components of module 101. For example, in some embodiments, module 101 includes a fan to move air, and air may enter or exit module 101 via cooling channels 102. Cooling channels 102 may, in some circumstances, include a relatively large open area (e.g., more than 50%) to achieve more effective convective cooling. The larger the open area, and characteristic length scale of openings of cooling channels 102, the more susceptible cooling channels 102 are to allowing transmission of EMI to outside of device 100 (e.g., the surroundings).

Section 120, which shows several cooling channels, is enlarged in FIG. 1. As illustrated, the cooling channels include respective "C-shaped" elements affixed to one another in a linear array to form cooling channels 102. As illustrated, cooling channels 102 include a height "H," a width "W," and a length "L."

Figure 2:
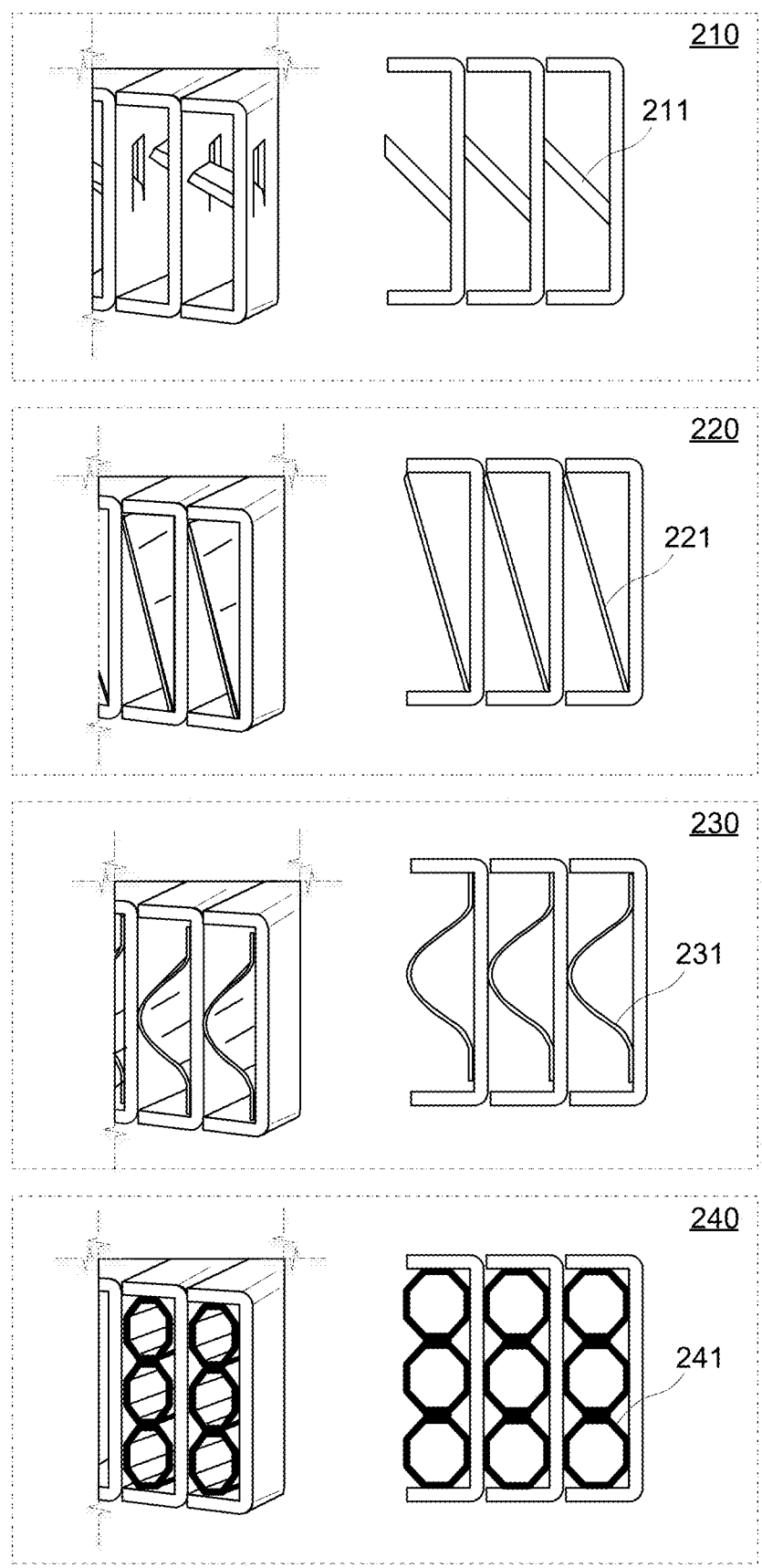
FIG. 2 shows several illustrative insert types arranged in cooling channels, in accordance with some embodiments of the present disclosure.

FIG. 2 shows several illustrative insert types arranged in cooling channels, in accordance with some embodiments of the present disclosure. The cooling channels of FIG. 2 are similar to cooling channels 102 of FIG. 1, although with EMI shielding in place. The illustrative cooling channels, fins, and inserts of FIG. 2 may be formed from metal, coated material, any other material having suitable EMI shielding properties, or any combination thereof.

Panel 210 shows a perspective view and front view of cooling channels having formed fins. Formed fin 211, as illustrated may be formed from the material of an element of a cooling channel (e.g., and as such, no additional material is needed aside from the cooling channel element). For example, the element is stamped, cut (e.g., plasma-cut, laser-cut, water-jet cut), or otherwise processed to create formed fin 211. Formed fin 211 extends into the open area of the respective cooling channel. Formed fin 211 may be any suitable shape. For example, as illustrated, formed fin 211 extends diagonally across the width and a center portion of the height of the channel.

Panel 220 shows a perspective view and front view of cooling channels having diagonal inserts. Insert 221, as illustrated may be formed from a sheet and may be inserted into the respective cooling channel (e.g., and as such, additional material aside from the cooing channel element is needed to create the shield). In some embodiments, because insert 221 is formed from material other than the cooling channel element, it may include any suitable material the same as or different from the cooling channel element. For example, insert 221 is stamped, cut (e.g., plasma-cut, laser-cut, water-jet cut), or otherwise processed from a sheet of material (e.g., a metal or metal alloy) to create insert 221. Insert 221 extends into the open area of the respective cooling channel diagonally across the width and height of the respective cooling channel. In some embodiments, insert 221 may have a thickness much less than the width of the cooling channel, so that the open area is not significantly impacted. In an illustrative example, the width of the cooling channel may be approximately 3 millimeters wide and insert 221 may be formed of 60 micron thick metal sheet, or any other suitable thickness of sheet metal at least an order of magnitude less than the width (e.g., at least a factor of ten less). In some embodiments, a fin of similar shape to insert 221 may be formed from material of an element of a cooling channel (e.g., and as such, no additional material is needed aside from the cooling channel element). For example, the element is stamped, cut (e.g., plasma-cut, laser-cut, water-jet cut), or otherwise processed to create a formed fin that extends into the open area of the respective cooling channel.

Panel 230 shows a perspective view and front view of cooling channels having half-wave shaped inserts. Insert 231, as illustrated may be formed from a sheet and may be inserted into the respective cooling channel (e.g., and as such, additional material aside from the cooing channel element is needed to create the shield). In some embodiments, because insert 231 is formed from material other than the cooling channel element, it may include any suitable material the same as or different from the cooling channel element. For example, insert 231 is stamped, cut (e.g., plasma-cut, laser-cut, water-jet cut), bent (e.g., by pressing), or otherwise processed from a sheet of material (e.g., a metal or metal alloy) to create insert 231. Insert 231 extends into the open area of the respective cooling channel the height of the respective cooling channel in a half-wave shape. In an illustrative example, the width of the cooling channel may be approximately 3 millimeters wide and insert 231 may be formed of 60 micron thick metal sheet, or any other suitable thickness of sheet metal at least an order of magnitude less than the width (e.g., at least a factor of ten less). In a further illustrative example, the profile shape may attenuate the desired frequency ranges, while allowing airflow in the cooling channels to flow without significant obstruction (e.g., greater than 95% of the flow of the no-insert case). In some embodiments, a fin of similar shape to insert 231 may be formed from material of an element of a cooling channel (e.g., and as such, no additional material is needed aside from the cooling channel element). For example, the element is stamped, cut (e.g., plasma-cut, laser-cut, water-jet cut), or otherwise processed to create a formed fin that extends into the open area of the respective cooling channel.

Panel 240 shows a perspective view and front view of cooling channels having honeycomb inserts. Insert 241, as illustrated, includes a hexagonal tube inserted in the cooling channel (e.g., wherein two more inserts are included in the same cooling channel). Insert 241 may be formed from a rolled-and-welded sheet, bent-and-welded sheet, an extruded tube, formed from any other suitable material stock, or any combination thereof. Accordingly, additional material aside from the cooing channel element is needed to create the EMI shield. In some embodiments, because insert 241 is formed from material other than the cooling channel element, it may include any suitable material the same as or different from the cooling channel element. Insert 241 extends fits within the respective cooling channel, and extending along any suitable length of the cooling channel. In an illustrative example, the width of the cooling channel may be approximately 3 millimeters wide and insert 241 may be formed of 180 micron thick metal sheet, or any other suitable thickness of sheet metal at least an order of magnitude less than the width (e.g., at least a factor of ten less).

Figure 3:
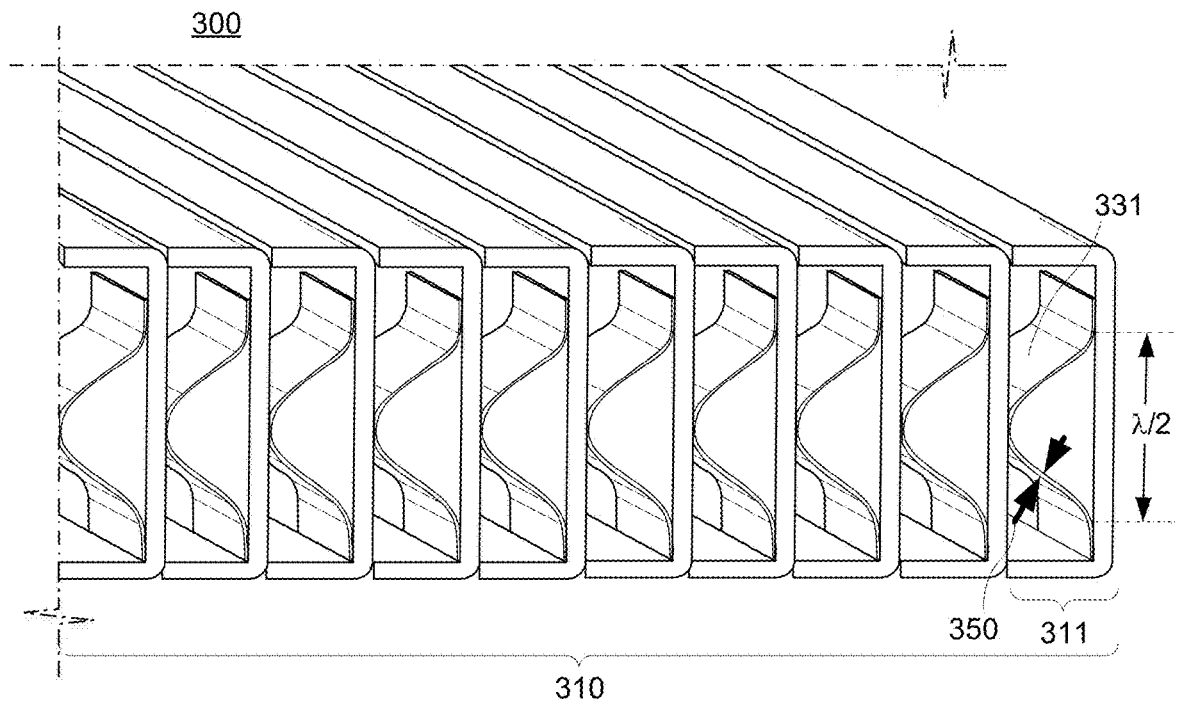
FIG. 3 shows a perspective view of a portion of an illustrative cooling channel assembly with EMI shielding, in accordance with some embodiments of the present disclosure.

FIG. 3 shows a perspective view of a portion of illustrative cooling channel assembly 300 with EMI shielding, in accordance with some embodiments of the present disclosure. Cooling channel assembly 300 includes cooling channels 310, arranged in an array, of which cooling channel 311 is one, and inserts, of which insert 331 is one. Each insert is arranged in a respective cooling channel of cooling channels 310. For example, insert 331 is inserted in cooling channel 311. In a further example, cooling channels 310 are similar to cooling channels 102 of FIG. 1, having a width, height, and length. Although insert 331 and cooling channel 311 will described in further detail, the description is understood to apply to all other inserts and cooling channels of cooling channel assembly 300.

Insert 331 is half-wave shaped, and formed from any suitable material. For example, insert 331 may be formed by cutting and bending an electronically conductive material (e.g., a metal or metal allow). The profile of insert 311 approximately follows a half wave for electromagnetic radiation corresponding to a wavelength "$\lambda$" as illustrated. Accordingly, the height of insert 331 is approximately "$\lambda/2$" along the height dimension of cooling channel 311. In some embodiments, insert 331 is approximately centered along the height of cooling channel 11. The amplitude of the profile of insert 331, as illustrated, corresponds to the width of cooling channel 311. Each cooling channel has a respective insert installed, thus providing shielding of EMI from a source (e.g., of the device in which cooling channel assembly 300 is installed). Because the source may have a distinct and predetermined spectral character, and generate EMI at in primary and relatively narrow spectral band, cooling channels 310, inserts installed therein, or both may be configured and arranged to shield EMI in the spectral band. For example, the profile shape of insert 331 follows a half-wave profile of a signal at the predetermined frequency. As illustrated, insert 331 includes a first section that follows a half-wave profile of a signal at the predetermined frequency (e.g., annotated in FIG. 3 with "$\lambda/2$"), and flat sections on either side (along the height dimension) of the first section that lie along cooling channel 311. For example, the first section and sections on either side define an insert height less than equal to the height of cooling channel 311. In an illustrative example, insert 331 may be configured to shield EMI at approximately 26 GHz, and has an amplitude of the profile shape that is approximately six millimeters and a half-wave width of six millimeters).

In some embodiments, the inserts (e.g., insert 331) have a thickness one order of magnitude or smaller than the width of the respective cooling channel (e.g., cooling channel 311). For example, as illustrated, insert 331 has thickness 350, which is much thinner than the width of cooling channel 311, thus not significantly blocking opening area of cooling channel 311 (e.g., and thus not significantly affecting convective cooling properties). In an illustrative example, the thickness of insert 331 may be less than 300 microns, less than 100 microns, or any other suitable thickness, which may be, but need not be, homogeneous throughout insert 331.

In some embodiments, insert 331 includes a profile shape having an amplitude (e.g., along the width dimension of cooling channel 311) less than or equal to the width of cooling channel 311. In some embodiments, insert 331 has an insert length, oriented along the length of cooling channel 331, that is less than the length of cooling channel 311. Insert 331 may be arranged at any suitable location along the length of cooling channel 311. For example, in some embodiments, as illustrated, insert 331 is arranged at one end of cooling channel 311. In a further example, insert 331 may be arranged inwards from the end of channel 311, although this arrangement may be more difficult fabricate (e.g., the insert must be installed further within the cooling channel). In some embodiments, insert 331 has an insert length that is greater than or equal to the width of the cooling channel 311. In some embodiments, insert 331 has an insert length that is greater than or equal to the half-wave width (e.g., greater than about 6 mm in the context of near-25 GHz EMI).

Figure 4:
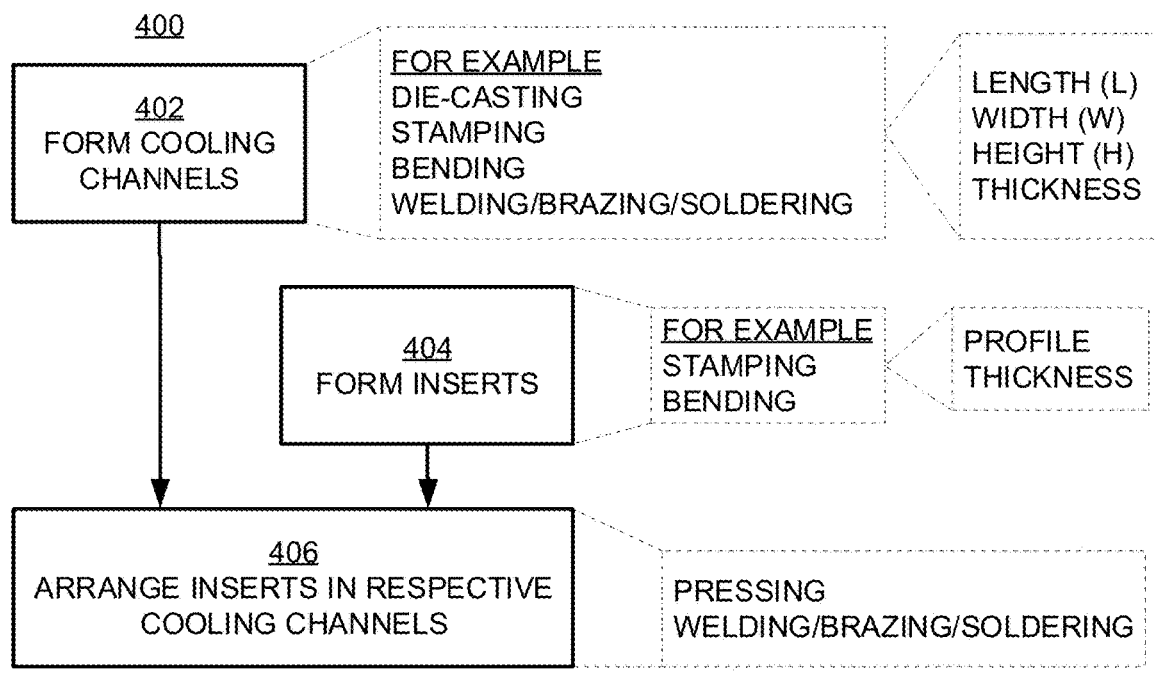
FIG. 4 shows an illustrative process for forming a cooling channel assembly, in accordance with some embodiments of the present disclosure.

FIG. 4 shows illustrative process 400 for forming a cooling channel assembly, in accordance with some embodiments of the present disclosure.

Step 402 includes forming a plurality of cooling channels arranged in an array, each cooling channel having a length, a width, a height, and a wall thickness. In some embodiments, cooling channels may be formed as a single component. For example, an array of cooling channels may be formed by die-casting using a molten material (e.g., metal or metal alloy) and a suitable shaping die. In some embodiments, cooling channels may be formed by forming a plurality of cooling channel elements and then joining the elements to form the array of cooling channels. For example, a plurality of cooling channel elements may be formed by cutting and bending metal sheet stock, and the elements may be joined by brazing in a brazing oven to form the array. Any suitable technique, or combination of techniques, may be used to form cooling channels in accordance with the present disclosure.

Step 404 includes forming a plurality of inserts for shielding interference, for example, to mitigate interference at a predetermined frequency. In some embodiments, each insert includes a thickness, an insert length, and a profile shape. For example, the thickness may be one order of magnitude or smaller than the width of the respective cooling channel. The profile shape may include any suitable shape and any suitable size. For example, the profile shape may have an amplitude. The insert may have any suitable insert length. In some embodiments, an insert may be formed by processing material that is separate from the cooling channels of step 402. For example, insets may be formed by cutting blanks form sheet metal stock and then bending the blanks to a desired profile. An insert may be stamped, bent, or otherwise deformed to achieve a desired profile shape using any suitable technique, or combination of techniques, in accordance with the present disclosure.

Step 406 includes arranging each insert in a respective cooling channel of the plurality of cooling channels, wherein when arranged, the amplitude of the profile shape is less than or equal to the width of the respective cooling channel. In some embodiments, step 406 may include pressing the inserts formed at step 404 into respective cooling channels of step 404 using a pressing or stamping machine. In some embodiments, step 406 includes welding, brazing, soldering, adhering, or otherwise affixing the insert in place in the cooling channel. In some embodiments, each insert need not be formed separately. For example, an insert array may be formed that includes each insert as well as adjoining material, and the insert array may be arranged in the array of cooling channels.

In some embodiments, when the insert is not installed, the insert comprises a free profile shape having a free amplitude larger than the width of the cooing channel. For example, the free shape of the insert, when not installed, is slightly larger than the cooling channel opening into which the insert is to be installed. Accordingly, arranging the insert in the cooling channel may include deforming the insert such that the amplitude is approximately equal to the width of the cooling channel. For example, the insert may be flexed or otherwise deformed to fit within the cooling channel, and then allowed to achieve a final shape constrained by the cooling channel. In a further example, the deformation may be relatively small in comparison to dimensions of the insert. To illustrate, when not installed, each insert may have a free profile shape with a free amplitude larger than the width of the respective cooing channel. When installed, the amplitude of the insert in its final configuration is approximately equal to the width of the respective cooling channel.

In some embodiments, steps 402, 404, and 406 may be combined, for example. For example, an insert may be formed from material of the cooling channels. In some embodiments, a plurality of cooling channel elements are formed, and stamped to form respective inserts of suitable shape.

Figure 5:
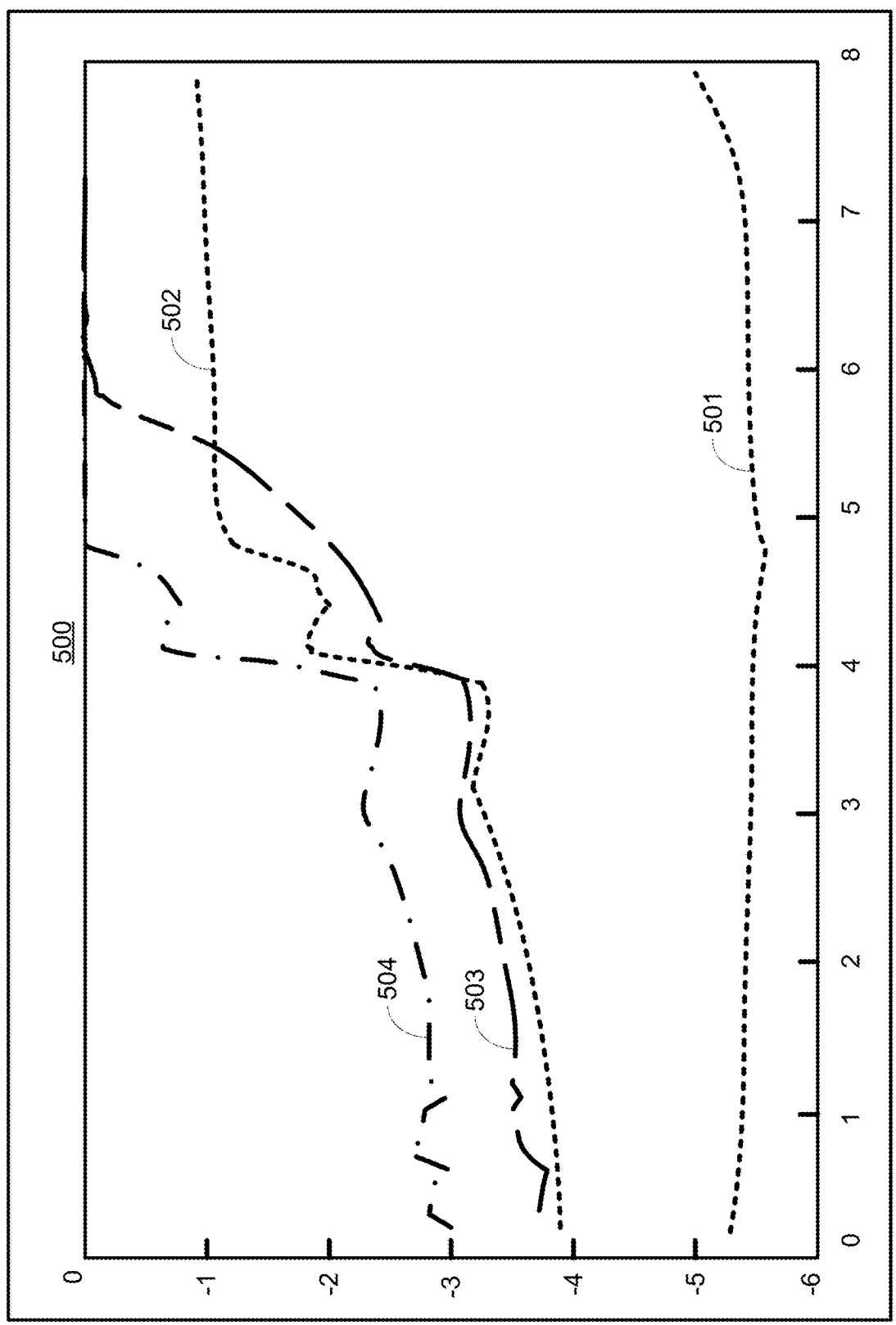
FIG. 5 shows an illustrative plot of spectral EMI transmission for cooling channels having various inserts arranged therein, in accordance with some embodiments of the present disclosure.

FIG. 5 shows illustrative plot 500 of spectral EMI transmission for cooling channels having various inserts arranged therein, in accordance with some embodiments of the present disclosure. The abscissa of plot 500 is presented in units of normalized frequency, and the ordinate of plot 500 is presented in units of normalized decibels (e.g., decreasing transmitted energy corresponds to the "down" direction, as illustrated). Spectral results for four types of shielding inserts are presented in plot 500. Curve 501 corresponds to a half-wave shaped insert, curve 502 corresponds to a honeycomb shaped insert, curve 503 corresponds to a diagonal shaped insert, and curve 504 corresponds to cooling channels having no insert (e.g., a reference case).

As expected, for all frequencies, curve 504 exhibits the highest decibel value, because all other arrangements included the same geometry as that associated with curve 504, but with additional shielding components (e.g., electrically conductive inserts). As shown, for frequencies below a cut-off frequency (e.g., about "4" in normalized frequency, as illustrated), all of curves 501-504 exhibit relatively good shielding. This is because the wavelengths of frequencies below the cut-off frequency are too large for the cooling channels to act as waveguides. More particularly, when the half-wavelength is approximately equal to or larger than the characteristic length scale of the cooling channels, the channels themselves provide EMI shielding. For example, for the cooling channels illustrated herein, the channel width provides a characteristic length scale. Although all illustrated arrangements exhibit good shielding at frequencies below the cut-off frequency, curve 501 provides the most shielding (e.g., an accordingly is well below curves 502-504 at frequencies less than the cut-off frequency). Curves 502-504 exhibit a sharp increase in normalized decibels at the cut-off frequency as the frequency increases. This is due to the corresponding half-wavelength being smaller than the characteristic length scale of the cooling channel. Essentially, at frequencies larger than the cut-off frequency, the cooling channels act as a waveguide for the electromagnetic radiation. For example, for frequencies above the cut-off frequency, the normalized decibel value of curve 504 (e.g., no insert) approaches "0," indicating that the cooling channels themselves provide no shielding to EMI. In such circumstances, the selection of insert is especially important. As illustrated in FIG. 5, the half-wave shaped insert does not exhibit a significant increase at the cut-off frequency, and exhibits relatively good shielding properties across the spectrum. Above the cut-off frequency, curves 502 and 503 exhibit some improved shielding as compared to curve 504, but do not perform as well as the half-wave shaped insert. Accordingly, not only the presence of an insert, but also the insert's profile shape, impact shielding performance.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. A system for cooling and shielding a computing system comprising:
   a plurality of cooling channels arranged in an array, each cooling channel having a length, a width, and a height; and
   a plurality of inserts for shielding interference over a frequency range, wherein each insert:
      is arranged in a cooling channel of the plurality of cooling channels,
      comprises a thickness less than or equal to one order of magnitude smaller than the width of the respective cooling channel,
      comprises a profile shape having an amplitude less than or equal to the width of the respective cooling channel, and
      comprises an insert length oriented along the length of the cooling channel.

2. The shielded cooling system of claim 1, wherein the insert length is greater than or equal to the width of the respective cooling channel.

3. The shielded cooling system of claim 1, wherein the profile shape follows a half-wave profile of a signal at the predetermined frequency.

4. The shielded cooling system of claim 1, wherein the profile shape comprises:
   a first section follows a half-wave profile of a signal at the predetermined frequency;
   a second section that lies along the respective cooling channel on a first side of the first section; and
   a third section that lies along the respective cooling channel on a second side of the first section opposite the first side, wherein the first section, the second section, and the third section define an insert height less than equal to the height of the respective cooling channel.

5. The shielded cooling system of claim 1, wherein:
   the predetermined frequency is approximately 26 GHz; and
   the amplitude of the profile shape of each insert is approximately six millimeters.

6. The shielded cooling system of claim 1, wherein the thickness of each insert is less than 100 microns.

7. The shielded cooling system of claim 1, wherein each insert is arranged at one end of the respective cooling channel, and wherein each insert is configured to allow airflow in the respective cooling channel.

8. The shielded cooling system of claim 1, wherein the plurality of inserts are each electronically conductive.

9. The shielded cooling system of claim 1, wherein:
   when not installed, each insert comprises a free profile shape having a free amplitude larger than the width of the respective cooing channel; and
   when installed, the amplitude is approximately equal to the width of the respective cooling channel.

10. The shielded cooling system of claim 1, wherein each insert is approximately centered along the height of the cooling channel.

11. An insert for shielding a cooling system of a computing system from interference over a frequency range, the insert comprising:
   a profile shape that fits within a cooling channel having a length, a width, and a height, wherein the profile shape comprises an amplitude less than or equal to the width of the respective cooling channel;
   a thickness less than or equal to one order of magnitude smaller than the width of the respective cooling channel; and
   an insert length oriented normal to the profile shape.

12. The insert of claim 11, wherein the insert length is greater than or equal to the width of the cooling channel.

13. The insert of claim 11, wherein the profile shape follows a half-wave profile of a signal at the predetermined frequency.

14. The insert of claim 11, wherein the profile shape comprises:
   a first section follows a half-wave profile of a signal at the predetermined frequency;
   a second section arranged to lay along the cooling channel on a first side of the first section; and
   a third section arranged to lay along the cooling channel on a second side of the first section opposite the first side, wherein the first section, the second section, and the third section define an insert height less than equal to the height of the cooling channel.

15. The insert of claim 11, wherein:
   the predetermined frequency is approximately 26 GHz; and
   the amplitude of the profile shape of the insert is approximately six millimeters.

16. The insert of claim 11, wherein the thickness of the insert is less than 100 microns.

17. The insert of claim 11, wherein the insert is electronically conductive.

18. The insert of claim 11, wherein:
   when not installed, the insert comprises a free profile shape having a free amplitude larger than the width of the cooing channel; and when installed, the amplitude is approximately equal to the width of the cooling channel.

19. A method for forming a cooling system for cooling and shielding a computing system; the method comprising:
forming a plurality of cooling channels arranged in an array, each cooling channel having a length, a width, and a height;
forming a plurality of inserts for shielding interference over a frequency range, wherein each insert comprises:
a thickness less than or equal to one order of magnitude smaller than the width of the respective cooling channel,
a profile shape having an amplitude, and
an insert length oriented along the length of the cooling channel; and
arranging each insert in a respective cooling channel of the plurality of cooling channels, wherein when arranged, the amplitude of the profile shape is less than or equal to the width of the respective cooling channel.

20. The method of claim 19, wherein when not installed, the insert comprises a free profile shape having a free amplitude larger than the width of the cooing channel, wherein arranging the insert in the respective cooling channel comprises deforming the insert such that the amplitude is approximately equal to the width of the cooling channel.

* * * * *